United States Patent
Park et al.

(10) Patent No.: US 7,948,768 B2
(45) Date of Patent: May 24, 2011

(54) TAPE CIRCUIT SUBSTRATE WITH REDUCED SIZE OF BASE FILM

(75) Inventors: Sang-Ho Park, Yongin-Si (KR); Sa-Yoon Kang, Seoul (KR); Si-Hoon Lee, Yongin-Si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 12/584,516

(22) Filed: Sep. 8, 2009

(65) Prior Publication Data

US 2010/0149775 A1    Jun. 17, 2010

Related U.S. Application Data

(63) Continuation of application No. 10/975,809, filed on Oct. 27, 2004, now Pat. No. 7,599,193.

(30) Foreign Application Priority Data

Dec. 3, 2003  (KR) .............................. 2003-0087297

(51) Int. Cl.
*H05K 7/02* (2006.01)
*H05K 7/06* (2006.01)
*H05K 7/08* (2006.01)
*H05K 7/10* (2006.01)

(52) U.S. Cl. ........ 361/783; 361/749; 361/782; 174/254; 174/255

(58) Field of Classification Search ................... None
See application file for complete search history.

(56) References Cited

U.S. PATENT DOCUMENTS

| 4,643,526 | A  | * | 2/1987  | Watanabe et al. ............. 349/151 |
| 5,016,986 | A  | * | 5/1991  | Kawashima et al. ......... 349/138 |
| 6,664,942 | B1 | * | 12/2003 | Kim et al. ....................... 345/92 |
| 7,034,813 | B2 | * | 4/2006  | Ishiyama ..................... 345/205 |

OTHER PUBLICATIONS

Japanese Patent Publication No. 60-071980 to Sakuma Kunio, having Publication date of Apr. 23, 1985 (w/ English Abstract page).
Japanese Patent Publication No. 11-031717 to Watanabe Katsumi, having Publication date of Feb. 2, 1999 (w/ English Abstract page).
Japanese Patent Publication No. 2002-287655 to Sakaki Yoichiro et al., having Publication date of Oct. 4, 2002 (w/ English Abstract page).
Japanese Patent Publication No. 2002-164629 to Kato Hiroki, having Publication date of Jun. 7, 2002 (w/ English Abstract page).

(Continued)

*Primary Examiner* — Tuan T Dinh
(74) *Attorney, Agent, or Firm* — Monica H. Choi (57) ABSTRACT

A tape circuit substrate includes a base film with first wiring and second wiring disposed on the base film. The first wiring extends into a chip mount portion through a first side and bends within the chip mount portion toward a second side. The second wiring extends into the chip mount portion through a third side and bends within the chip mount portion toward the second side. The first, second, and third sides are different sides of the chip mount portion. Thus, size and in turn cost of the base film are minimized by arranging wirings within the chip mount portion for further miniaturization of electronic devices, such as a display panel assembly, using the tape circuit substrate.

6 Claims, 7 Drawing Sheets

OTHER PUBLICATIONS

Japanese Patent Publication No. JP11031717 to Wtanabe, having Publication date of Feb. 2, 1999 (w/ English Abstract page).
Japanese Patent Publication No. JP2001056481 to Sakaki et al., having Publication date of Feb. 27, 2001 (w/ English Abstract page).
Japanese Patent Publication No. 2002-236458 to Sugimoto et al., having Publication date of Aug. 23, 2002 (w/ English Abstract page).
Japanese Patent Publication No. 2003-255386 to Otomo, having Publication date of Sep. 10, 2003 (w/ English Abstract page).

* cited by examiner

TAPE CIRCUIT SUBSTRATE WITH REDUCED SIZE OF BASE FILM

The present application is a continuation of an earlier filed patent application with Ser. No. 10/975,809 filed on Oct. 27, 2004 now U.S. Pat. No. 7,599,193, for which priority is claimed. This earlier filed patent application with Ser. No. 10/975,809 is in its entirety incorporated herewith by reference.

The present application also claims priority under 35 USC §119 to Korean Patent Application No. 2003-0087297, filed on Dec. 3, 2003, in the Korean Intellectual Property Office, the disclosure of which is incorporated herein in its entirety by reference. A certified copy of Korean Patent Application No. 2003-0087297 is contained in the parent patent application with Ser. No. 10/975,809.

BACKGROUND OF THE INVENTION

1. Field of the Invention

The present invention relates to tape circuit substrates, and more particularly, to a tape circuit substrate having a base film reduced in size by minimizing wirings arranged outside a chip mount portion, with example application for a display panel assembly.

2. Background of the Invention

Electronic products such as mobile phones, personal digital assistants (PDAs), liquid crystal panels, and notebook computers, continue to be made smaller, shorter, thinner, and lighter. Thus, parts of such electronic products including mounting of semiconductor chips within such electronic products are desired to be smaller, lighter, highly efficient, and of higher density.

Liquid crystal display devices are being developed to be implemented as one-chip ICs without forming a gate PCB (printed circuit board). However, gate driver chip packages typically do not accommodate such a semiconductor chip structure.

As a result, several new gate driver tape carrier package (TCP) structures have been proposed in which a gate driver PCB is not provided in a liquid crystal display device, including Korean Patent Publication No. 2000-66493 entitled "A Tape Carrier Package, Liquid Crystal Display Panel Assembly having the same, Liquid Crystal Display Device Using the Same and Assembling method thereof", Korean Patent Publication No. 2001-91646 entitled "Drive and Application timing Determination Module, Liquid Crystal Display Panel Assembly Using the Same, and Method for Testing Driving Signals of the Liquid Crystal Display Panel Assembly", and Korean Patent Publication No. 2001-9044 entitled "Signal Connecting Member for Liquid Crystal Display Device and Drive IC Mounted thereon".

Figure 1:
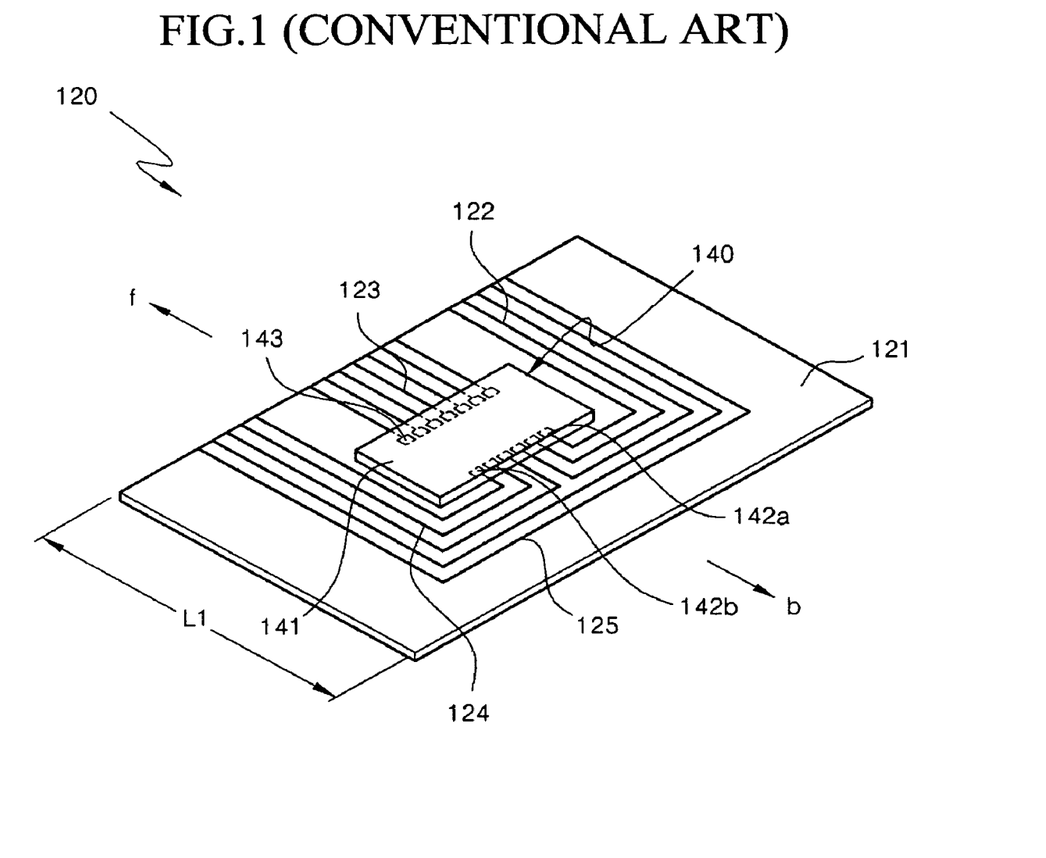
FIG. 1 is a perspective view of a gate driver TCP of a conventional display panel assembly.

Referring to FIG. 1, such references disclose a gate driver TCP 120 including gate driving signal output wiring 123, input pads 142a, and output pads 143. Furthermore, the gate driver TCP 120 is configured with input wirings 122, bypass wirings 125, and output wirings 124 surrounding edges of a semiconductor chip 140. Such wirings 122, 125, and 124 extend along left, upper, and right sides of a base film 121, undesirably resulting in an increase in the area of the base film 121 outside the semiconductor chip 140.

Thus referring to FIG. 1, a length L1 of the base film 121 is increased with such wirings 122, 125, and 124, making the area of the base film 121 and thus the overall size of gate driver TCP 120 larger. With such larger area, miniaturization of a liquid crystal display device is more difficult. In addition, the amount of expensive material for the base film 121 is increased, which is not cost-effective.

SUMMARY OF THE INVENTION

Accordingly, a tape circuit substrate is formed with a base film having minimized area by arranging wirings within a chip mount portion.

In one embodiment of the present invention, a tape circuit substrate includes a base film with first wiring and second wiring disposed on the base film. The first wiring extends into a chip mount portion through a first side and bends within the chip mount portion toward a second side. The second wiring extends into the chip mount portion through a third side and bends within the chip mount portion toward the second side. The first, second, and third sides are different sides of the chip mount portion.

In an example embodiment of the present invention, the base film is comprised of an insulating material.

In another example embodiment of the present invention, the second side is orthogonal to the first side. Furthermore, the third side is parallel to the first side.

In a further embodiment of the present invention, the tape circuit substrate further includes third wiring, disposed on the base film, that extends into the chip mount portion through a fourth side that is different from the first, second, and third sides. The fourth side is orthogonal to the first side in an example embodiment.

In still another embodiment of the present invention, the tape circuit substrate further includes bypass wiring disposed on the base film. The bypass wiring extends parallel to the second side, and the bypass wiring is disposed either outside of the chip mount portion or within the chip mount portion.

In yet another embodiment of the present invention, the tape circuit substrate is part of a semiconductor chip package having a semiconductor chip mounted over the chip mount portion with electrode pads of the semiconductor chip coupled to the first and second wirings.

The present invention is applied to particular advantage when such a semiconductor chip package is part of display panel assembly with the semiconductor chip being a display panel driver chip. In that case, the first and second wirings of the tape circuit substrate couple the display panel driver chip to electrode terminals of a display panel.

BRIEF DESCRIPTION OF THE DRAWINGS

The above features and advantages of the present invention will become more apparent when described in detail with reference to the attached drawings in which.

DETAILED DESCRIPTION OF PREFERRED EMBODIMENTS

Example embodiments of the present invention are now described with reference to the accompanying drawings. However, this invention may be embodied in many different forms and should not be construed as being limited to the embodiments set forth herein. In the drawings, the same reference numerals in different drawings refer to elements having similar structure and function.

Example display panel assemblies for embodiments of the present invention include, but are not limited to, a thin film transistor-liquid crystal display (TFT-LCD), a plasma display panel (PDP), and an organic electroluminescence display device.

An example tape circuit substrate for embodiments of the present invention include, but are not limited to, a flexible printed circuit board (FPCB) in which wiring patterns are formed on a base film, such as a tape carrier package (TCP) or a chip on film (COF). Such a tape circuit substrate is constructed with a wiring pattern layer and inner leads connected thereto formed on a thin film made of an insulating material, e.g., polyimide resin. The tape circuit substrate includes prefabricated bumps and a wiring substrate for TAB (Tape Automated Bonding) of the inner leads of the tape circuit substrate to a semiconductor chip. The above-referenced tape circuit substrate is used as example embodiments only.

In the embodiments of the present invention that follow, a TFT-LCD is described for a display panel assembly, a gate driver semiconductor chip package is described for a semiconductor chip package having a panel driver semiconductor chip mounted thereon, and a COF is described for a tape circuit substrate, for illustrative convenience. However, the present invention may also be implemented for other types of display panel assembly, semiconductor chip package, and tape circuit substrate.

A first embodiment of the present invention is now described with reference to FIGS. 2A, 2B, 2C, 3, and 4.

Figure 2A:
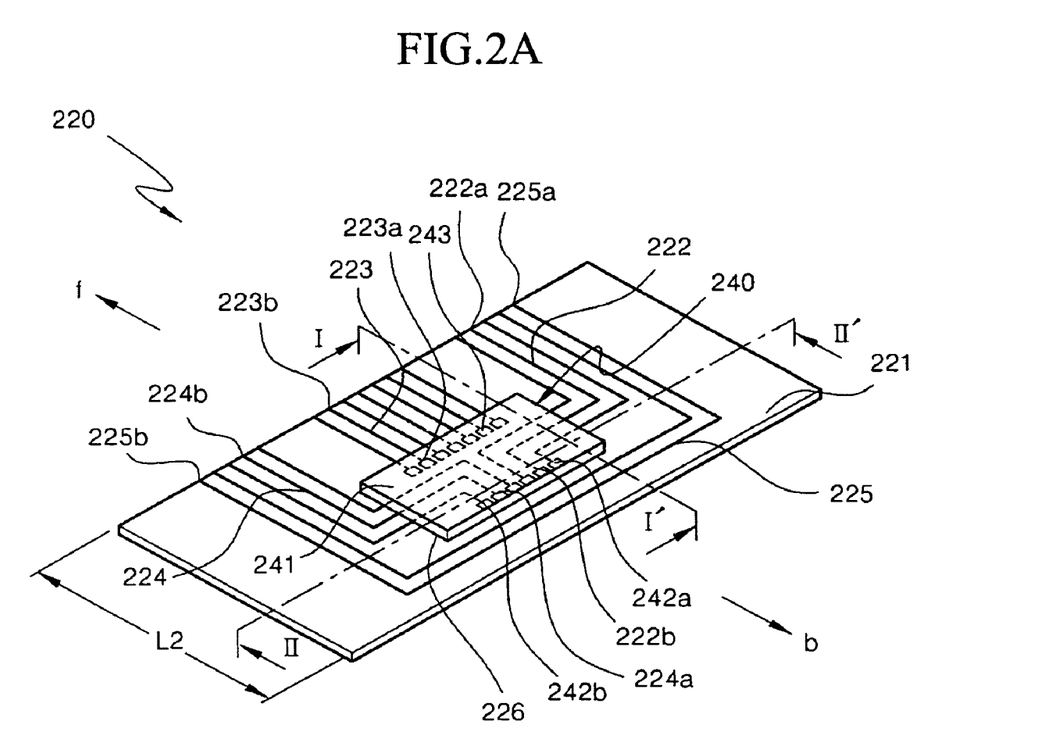
FIG. 2A is a perspective view of a semiconductor chip package according to a first embodiment of the present invention.

FIG. 2A is a perspective view of a gate semiconductor chip package 220 according to the first embodiment of the present invention. FIG. 2A illustrates a connected state of input pads 242a and 242b and output pads 243 of a gate driver semiconductor chip 240 and signal transmission wirings formed on a base film 221.

The gate semiconductor chip package 220 includes the base film 221 made of a flexible material and a gate driver semiconductor chip 240. In addition, input wirings 222, first output wirings 223; second output wirings 224, and bypass wirings 225 are formed on a top surface of the base film 221. The gate driver semiconductor chip 240 is electrically connected to the input wirings 222, the first output wirings 223, and the second output wirings 224, but is disconnected from the bypass wirings 225. The gate driver semiconductor chip 240 is mounted on the base film 221 by flip chip bonding in one embodiment of the present invention.

Referring to FIG. 2A, the base film 221, the input wirings 222, the first output wirings 223, the second output wirings 224, and the bypass wirings 225 comprise "a gate tape circuit substrate". The portion of the base film 221 onto which the gate driver semiconductor chip 240 is mounted, is referred to as a "chip mount portion" 226.

Within the chip mount portion 226, leading edges 222b, 223a, and 224a of the input wirings 222, the first output wirings 223, and the second output wirings 224, respectively, are formed on the base film 221. For protecting the wirings 222, 223, and 224 from adverse environmental conditions, the region of the tape circuit substrate 220 outside of the chip mount portion 226 is covered with a layer of protective material, such as solder resist for example.

The base film 221 is comprised of an insulating material, such as polyimide resin or polyester resin for example, having a thickness of approximately 20 to approximately 100 µm, in one embodiment of the present invention. The input wirings 222, the first output wirings 223, the second output wirings 224, and the bypass wirings 225 are formed from a wiring layer having a thickness of approximately 5 to approximately 20 µm. In one example embodiment, such a wiring layer is a metal foil of copper (Cu) that is plated with tin, gold, nickel or solder.

Example methods for forming such a layer of copper foil include casting, laminating, electroplating and the like. In casting, a liquid base film is applied to a rolled copper foil with subsequent thermal curing. In laminating, a rolled copper foil is placed on a base film for subsequent thermal compression. In electroplating, a copper seed layer is deposited on a base film which is then immersed within a copper-containing electrolyte, thereby forming the copper foil when electricity is applied.

Wirings are then patterned from the copper foil. For example, a photo/etching process is performed on the copper foil to selectively etch the copper foil for patterning the wirings.

Referring to FIG. 2A, the input wirings 222 are disposed along the right edge of the base film 221 at the right side of the chip mount portion 226. The input wirings 222 are disposed parallel to each-other, and extend into the chip mount portion 226 through the right side (i.e., a first side) of the chip mount portion 226 to then be arranged within the chip mount portion 226.

Within the chip mount portion 226 (i.e., underneath the semiconductor chip 240), the input wirings 222 bend to extend toward the back side (i.e., a second side) of the chip mount portion 226. The back side of the chip mount portion 226 is the side towards the "b" direction in FIG. 2A, and thus such a back side is orthogonal to the right side of the chip mount portion 226.

One ends 222a of the input wirings 222 are electrically connected to gate driving signal transmission lines (101a of FIG. 4) of a display panel, and the other ends 222b within the chip mount portion 226 are electrically connected to input pads 242a disposed on the gate driver semiconductor chip 240. The input pads 242a are disposed along the side of the semiconductor chip 240 that is near the back side of the chip mount portion 226.

The second output wirings 224 are disposed along the left edge of the base film 221 at the left side of the chip mount portion 226. The second output wirings 224 are disposed parallel to each-other, and extend into the chip mount portion 226 through the left side (i.e., a third side) of the chip mount portion 226 to then be arranged within the chip mount portion 226.

Within the chip mount portion 226 (i.e., underneath the semiconductor chip 240), the second output wirings 224 bend to extend toward the back side (i.e., the second side) of the chip mount portion 226. The right side and the left side of the chip mount portion 226 are parallel to each other and are each orthogonal to the back side.

Figure 4:
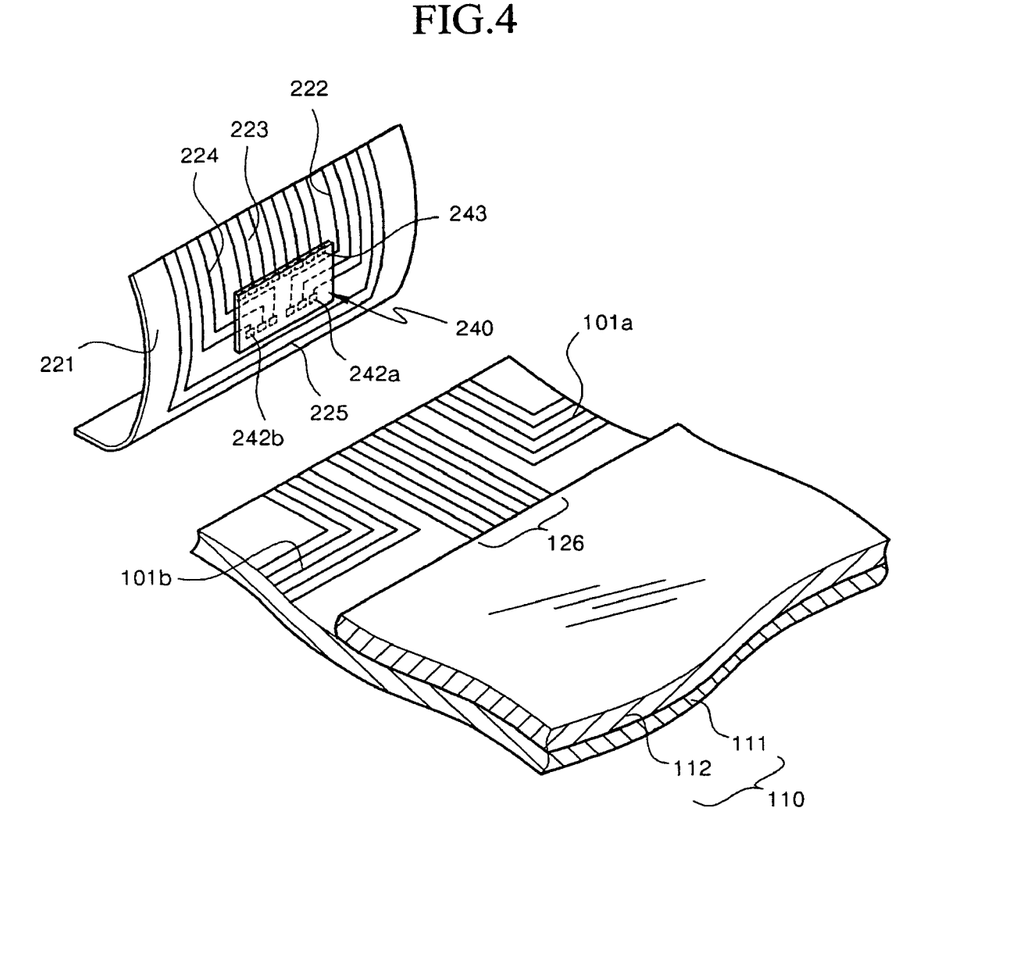
FIG. 4 is an enlarged perspective view of a portion B of FIG. 3.

One ends 224a of the second output wirings 224 are electrically connected to input pads 242b of the gate driver semiconductor chip 240, and the other ends 224b of the second output wirings 224 are electrically connected to gate driving signal transmission lines of the display panel (101b of FIG. 4). The input pads 242b are disposed along the side of the semiconductor chip 240 that is near the back side of the chip mount portion 226.

In the embodiment of FIG. 2A, three input pads 242a disposed within the right-half of the semiconductor chip 240 are electrically connected to the input wirings 222. On the other hand, three input pads 242b disposed within the left-half of the semiconductor chip 240 are electrically connected to the second output wirings 224.

Further referring to FIG. 2A, the bypass wirings 225 are disposed on the base film 221 around the right side, the back side, and the left side of the chip mount portion 226. The bypass wirings 225 are parallel to each-other along such sides. One ends 225a and the other ends 225b of the bypass wirings 225 are both connected to gate driving signal transmission lines (101a and 101b of FIG. 4). In the embodiment of FIG. 2A, the portion of the bypass wirings 225 disposed parallel to the back side of the chip mount portion 226 are disposed outside of the chip mount portion 226.

Additionally referring to FIG. 2A, the first output wirings 223 are disposed on the base film 221 to extend from a front side (i.e., the side toward the "f" direction in FIG. 2A) of the base film 221. The first output wirings 223 extend into the chip mount portion 226 through the front side (i.e., a fourth side) of the chip mount portion 226 to then be arranged within the chip mount portion 226.

In the embodiment of FIG. 2A, one ends 223a of the first output wirings 223 are electrically connected to output pads 243 of the gate driver semiconductor chip 240, and the other ends 223b of the first output wirings 223 are electrically connected to gate lines of the display panel (126 of FIG. 4). The output pads 243 are disposed toward the front side of the semiconductor chip 240 in FIG. 2A.

Connecting units (not shown) are typically used for connecting ends of the wirings 222, 223, and 224 to the semiconductor chip 240. Such connecting units may be metal bumps that electrically connect the wirings 222, 223, and 224 to the semiconductor chip 240. Such connecting units have a thickness of about 10 μm to about 18 μm and are comprised of a conductive material such as gold (Au), copper (Cu) or solder, in an example embodiment of the present invention. Adhesion between the connecting units and the wirings 222, 223, and 224 may be achieved by thermal compression.

Figure 2B:
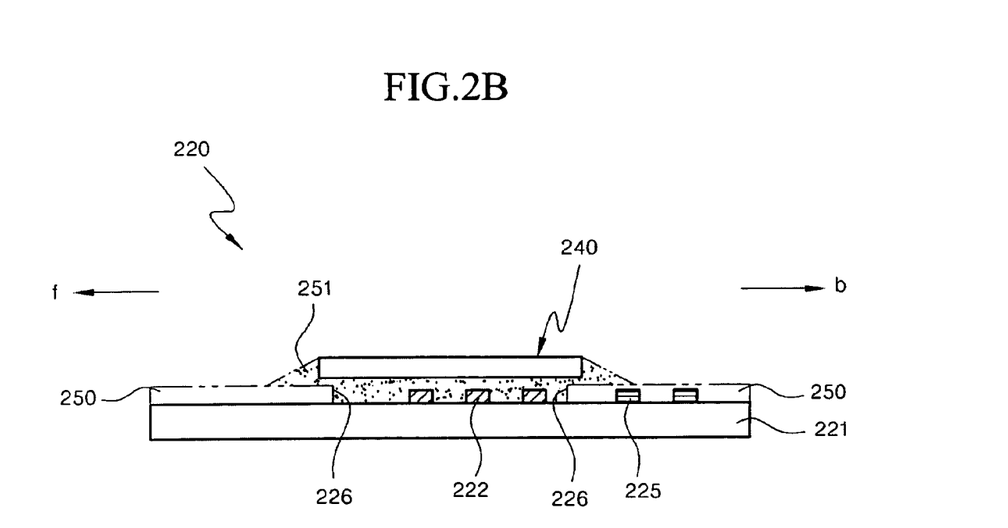
FIG. 2B is a cross-sectional view taken along line I-I' of FIG. 2A.
Figure 2C:
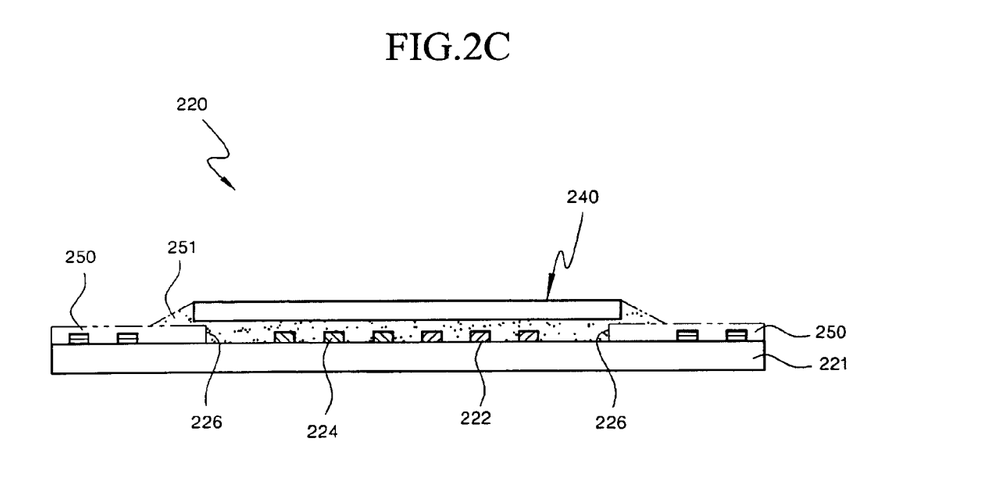
FIG. 2C is a cross-sectional view taken along line II-II' of FIG. 2A.

FIG. 2B is a cross-sectional view along line I-I' of FIG. 2A, and FIG. 2C is a cross-sectional view along line II-II' of FIG. 2A. Referring to FIGS. 2B and 2C, the input wirings 222 and the second output wirings 224 are formed within the chip mount portion 226 over which the gate driver semiconductor chip 240 is mounted.

To preserve the integrity of the wirings 222, 223, 224, and 225, a region of the base film 221 outside of the chip mount portion 226 is covered with a layer of protective material 250 comprised of solder resist for example. Thus, portions of the wirings 222, 223, 224, and 225 disposed on the base film 221 outside of the chip mount portion 226 are protectively covered by the layer of protective material 250. Further referring to FIGS. 2B and 2C, the input wirings 222 and the second output wirings 224 formed within the chip mount portion 226 are encapsulated by an insulating encapsulation resin 251 which is comprised of epoxy resin or silicon resin for example.

Referring to FIG. 2A, the gate driver semiconductor chip 240 includes a main body 241 having a built-in circuit, the input pads 242a and 242b, and the output pads 243. The input pads 242a and 242b are divided into two groups in FIG. 2A, with first input pads 242a being electrically connected to the input wirings 222, and with second input pads 242b being electrically connected to the second output wirings 224. In contrast, the output pads 243 are not divided and are electrically connected to the first output wirings 223.

In one example embodiment, the first input pads 242a and the second input pads 242b have a one-to-one electrical connection relationship. Thus, the first input pads 242a and the second input pads 242b form a so-called mirror structure. In such a mirror structure, a pair of respective input pads 242a and 242b are connected to each other through a circuit of the gate driver semiconductor chip 240 and output a same kind of signal.

In this manner, the input wirings 222 and the second output wirings 224 are formed to enter through the right and left sides of the chip mount portion 226 and are arranged within the chip mount portion 226 to be electrically connected to input pads 242a and 242b of the semiconductor device 240. Thus, the input wirings 222 and the second output wirings 224 are not disposed outside of the chip mount portion 226 toward the back side of the base film 221.

Figure 3:
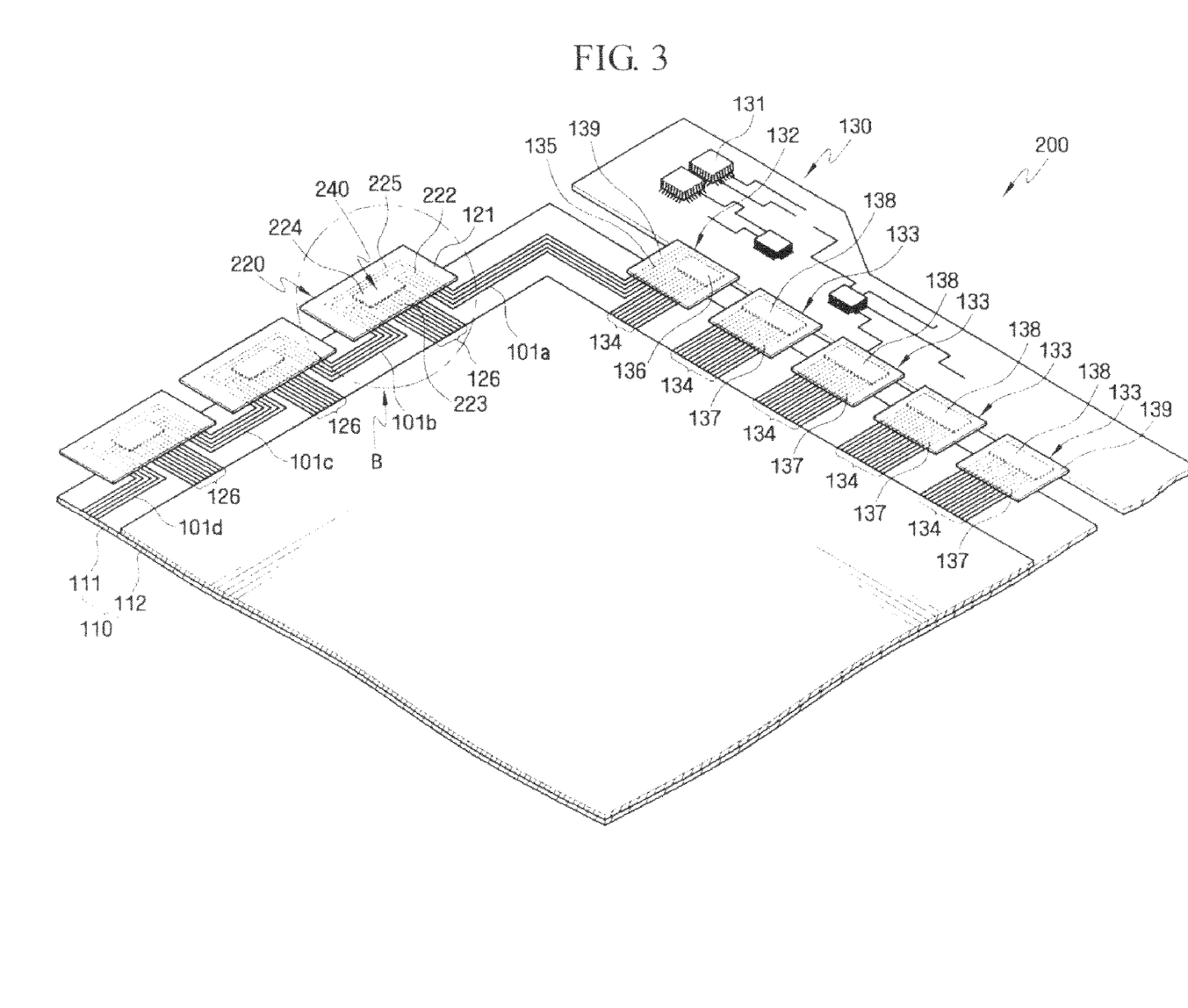
FIG. 3 is a perspective view of a display panel assembly using the semiconductor chip package of FIG. 2A, according to an embodiment of the present invention.

As a result, referring to FIG. 2, the length L2 of the base film 221 is minimized such that the gate semiconductor chip package 220 and a display panel assembly 200 of FIG. 3 incorporating the semiconductor chip package 220 is miniaturized. In addition, the amount of an expensive film comprising the base film 221, and in turn fabrication cost, are advantageously reduced.

In the embodiment of FIG. 2A, assume for example that the number of the input wirings 222 or of the second output wirings 224 is in the range of 10 to 20, such as 15, and that the pitch of the input wirings 222 or of the second output wirings 224 is in the range of 30 to 100 μm, such as 40 μm. In that case, since the input wirings 222 and the second output wirings 224 are not disposed outside of the chip mount portion 226 toward the back side of the base film 221, the length L2 of the base film 221 is reduced by approximately 600 μm.

When the length L1 of the conventional base film 121 of FIG. 1 is approximately 5000 to approximately 15000 μm, such as 6000 μm, the length L2 of the base film 221 of FIG. 2A is approximately 5400 μm. In this manner, about 10% of the length of the base film 221 is reduced.

FIG. 3 is a perspective view of a display panel assembly 200 using the semiconductor chip package 220. Referring to FIG. 3, the display panel assembly 200 includes a display panel 110, a gate semiconductor chip package 220, source semiconductor chip packages 132 and 133, and an integrated PCB (printed circuit board) 130.

The display panel 110 includes a lower substrate 111 having gate lines, data lines, TFTs (thin film transistors), and pixel electrodes. The display panel also includes an upper substrate 112 which is smaller than the lower substrate 111 and which is laminated thereon to face the lower substrate 111. The upper substrate 112 has a black matrix, color pixels, and a common electrode. A liquid crystal (not shown) is disposed between the upper substrate 112 and the lower substrate 111.

The gate semiconductor chip package 220 is connected to gate lines 126 of the lower substrate 111, and the source semiconductor chip packages 132 and 133 are connected to data lines 134 of the lower substrate 111. The integrated PCB 130 includes a plurality of driving components 131, which are semiconductor chips designed according to one-chip technology as described above. Gate and data driving signals are input to the gate semiconductor chip package 220 and the source semiconductor chip packages 132 and 133, respectively.

Referring to FIG. 3, the gate lines 126 are equally spaced from each other in an effective display region of the display panel 110 where an image is displayed. However, for connection with the gate semiconductor chip package 220 in a peripheral portion of the lower substrate 111, the gate lines 126 form a series of groups with the gate lines 126 within a group being narrowly spaced from each other. FIG. 3 shows three groups of such gate lines 126, for example.

Similarly, the data lines 134 are equally spaced from each other in an effective display region of the display panel 110 where an image is displayed. However, the data lines 134 are narrowly spaced from each other in a peripheral portion of the lower substrate 111 for connection with the source semiconductor chip packages 132 and 133. FIG. 3 shows five groups of such data lines 134, for example.

Further in the display panel assembly 200, first gate driving signal transmission lines 101a are arranged at the edge of the lower substrate 111 between the gate semiconductor chip package 220 and the adjacent source semiconductor chip package 132. One ends of the gate driving signal transmission lines 101a extend toward the data lines 134 and the other ends thereof extend toward the gate lines 126.

Second, third, and fourth gate driving signal transmission lines 101b, 101c, and 101d, respectively, are also formed between the gate lines 126. A plurality of semiconductor chip packages is formed along the periphery portion of the lower substrate 111. The second, third, and fourth gate driving signal transmission lines 101b, 101c, and 101d are each disposed to extend between two adjacent semiconductor chip packages.

The source semiconductor chip package 132, compatible with gate and data driving signals, is disposed separately from the source semiconductor chip packages 133 which are for the data driving signals. The source semiconductor chip package 132 includes a plurality of driving signal transmission wirings 135 and a data driver semiconductor chip 136 electrically connected to the driving signal transmission wirings 135. The data driver semiconductor chip 136 is mounted on a base film 139 by flip chip bonding.

Some of the driving signal transmission wirings 135 are not connected to the data driver semiconductor chip 136 but are connected to the first gate driving signal transmission lines 101a of the lower substrate 111. Such driving signal transmission wirings 135 connected to the first gate driving signal transmission lines 101a serve to transfer the gate driving signals from the integrated PCB 130 to the gate semiconductor chip package 220. Others of the driving signal transmission wirings 135 are connected to the data driver semiconductor chip 136 and the data lines 134 of the lower substrate 111 for transfer of the data driving signals from the integrated PCB 130 to the TFTs of the display panel 110.

Each of the semiconductor chip packages 133 dedicated to data driving signals includes a plurality of driving signal transmission wirings 137 and a data driver semiconductor chip 138 that is connected to the driving signal transmission wirings 137. The data driver semiconductor chip 138 is mounted on the base film 139 by flip chip bonding.

FIG. 4 is an enlarged perspective view of a portion "B" of FIG. 3. FIG. 4 illustrates the gate semiconductor chip package 220 mounted on the lower substrate 111 of the display panel. In addition, FIG. 4 illustrates how the signal transmission wirings formed on the base film 221 of the gate semiconductor chip package 220 are connected to the signal transmission wirings formed on the lower substrate 111 of the display panel 110.

Signals are generated from the integrated PCB 130 to the gate semiconductor chip package 220 in the following manner. When image signals are input to the integrated PCB 130 from an external information processor, the integrated PCB 130 generates gate and data driving signals corresponding to the input image signals. The data driving signals generated from the integrated PCB 130 are sent to the data driver semiconductor chips 136 and 138 via the driving signal transmission wirings 135 and 137 of the semiconductor chip packages 132 and 133 to then be processed. Thereafter, the processed data driving signals are sent through the driving signal transmission wirings 135 and 137 again to then be transmitted to the data lines 134 of the lower substrate 111.

At the same time, the gate driving signals generated from the integrated PCB 130 are sent to the first gate driving signal transmission lines 101a of the lower substrate 111 via the driving signal transmission wirings 135 of the semiconductor chip package 132. The gate driving signals sent on the bypass wirings 225 are transferred to the second gate driving signal transmission lines 101b of the lower substrate 111 along the first gate driving signal transmission lines 101a without passing through the gate driver semiconductor chip 240.

The gate driving signals input to first input pads 242a along the first gate driving signal transmission lines 101a via the input wirings 222 is transferred to the gate driver semiconductor chip 240. The gate driving signals are further processed by a circuit of the gate driver semiconductor chip 240 into output signals. Such output signals are then transferred to the gate lines 126 of the lower substrate 111 along the output pads 243 via the first output wirings 223.

Furthermore, the gate driving signals at the second input pads 242b are output to the second gate driving signal transmission lines 101b via the second output wirings 224 for driving the adjacent semiconductor chip package. In this manner, the gate driving signals output to the gate driving signal transmission lines 101b are sequentially processed along the sequentially disposed gate semiconductor chip packages with flow through the second, third, and fourth gate driving signal transmission lines 101b, 101c, and 101d.

Gate driving signals from the integrated PCB 130 are continuously supplied to the semiconductor chip 240 of the gate semiconductor chip package 220 for generating images on the display panel 110. When a gate output signal is applied on one of the gate lines 126, TFTs of a corresponding row are turned on such that driving voltages from the data driver semiconductor chips 136, 138 are rapidly output to pixel electrodes. As a result, a respective electric field is formed between each pixel electrode and the common electrode which determines the arrangement of the liquid crystal interposed between the upper substrate 112 and the lower substrate 111, thereby displaying image information.

Figure 5A:
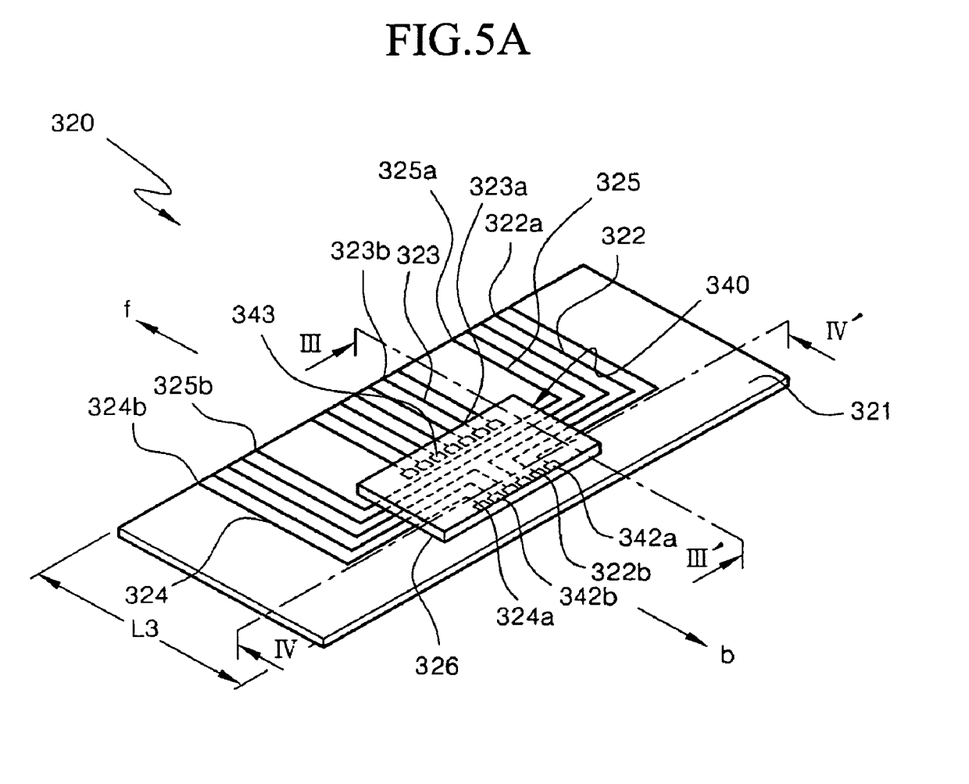
FIG. 5A is a perspective view of a semiconductor chip package according to a second embodiment of the present invention.

A semiconductor chip package 320 according to a second embodiment of the present invention is now described with reference to FIGS. 5A, 5B, and 5C. FIG. 5A is a perspective view of a semiconductor (gate) chip package 320 according to the second embodiment of the present invention, FIG. 5B is a cross-sectional view along line III-III' of FIG. 5A, and FIG. 5C is a cross-sectional view along line IV-IV' of FIG. 5A.

Figure 5B:
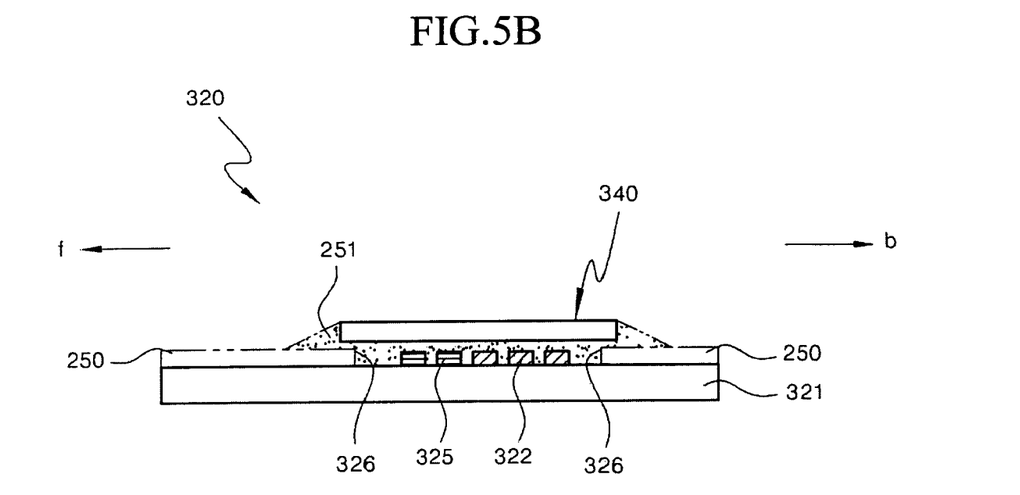
FIG. 5B is a cross-sectional view taken along line III-III' of FIG. 5A.
Figure 5C:
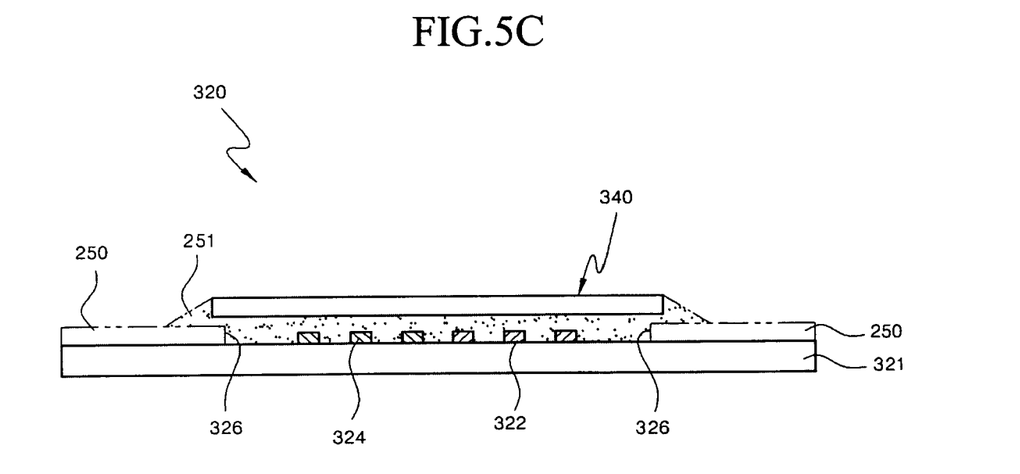
FIG. 5C is a cross-sectional view taken along line IV-IV' of FIG. 5A.

Structures of the gate semiconductor chip package 320 shown in FIGS. 5A, 5B, and 5C and the display panel assembly using the same are similar to those of FIGS. 2A, 2B, 2C, 3, and 4. However, the gate semiconductor chip packages 220 of FIG. 2A and 320 of 5A are different in that the bypass wirings 325 of the gate semiconductor chip package 320 of FIG. 5A pass through the chip mount portion 326. Therefore, the base film 321 of the gate semiconductor chip package 320 has a length L3 in FIG. 5A that is smaller than the length L2 in FIG. 2A.

In detail, referring to FIG. 5A, the semiconductor chip package 320 includes a base film 321 made of a flexible material. The semiconductor chip package 320 also includes input wirings 322, first output wirings 323, second output wirings 324, and bypass wirings 325, formed on one surface of the base film 321. A gate driver semiconductor chip 340 is electrically connected to the input wiring 322 and the first and second output wirings 323 and 324.

In addition, the gate driver semiconductor chip 340 is mounted on the base film 321 by flip chip bonding, in the example embodiment of FIG. 5A. The base film 321, the input wirings 322, the first output wirings 323, the second output wirings 324, and the bypass wirings 325 form a "tape circuit substrate". A portion of the base film 321 onto which the gate driver semiconductor chip 340 is mounted is referred to as the "chip mount portion" 326.

The input wirings 322, the first output wirings 323, the second output wirings 324, and the bypass wirings 325 are formed from a wiring layer having a thickness of about 5 μm to about 20 μm. Such a wiring layer is comprised of a metal material such as a copper (Cu) foil for example. In addition, tin, gold, nickel or soldering is plated on the surface of the copper foil, in one embodiment of the present invention.

Referring to FIG. 5A, the input wirings 322 are disposed along the right edge of the base film 321 at the right side of the chip mount portion 326. The input wirings 322 are disposed parallel to each-other, and extend into the chip mount portion 326 through the right side (i.e., a first side) of the chip mount portion 326 to then be arranged within the chip mount portion 326.

Within the chip mount portion 326 (i.e., underneath the semiconductor chip 340), the input wirings 322 bend to extend toward the back side (i.e., a second side) of the chip mount portion 326. The back side of the chip mount portion 326 is the side towards the "b" direction in FIG. 5A, and thus such a back side is orthogonal to the right side of the chip mount portion 326.

One ends 322a of the input wirings 322 are electrically connected to gate driving signal transmission lines (101a of FIG. 4) of a display panel, and the other ends 322b within the chip mount portion 326 are electrically connected to input pads 342a disposed on the gate driver semiconductor chip 340. The input pads 342a are disposed along the side of the semiconductor chip 340 that is near the back side of the chip mount portion 326.

The second output wirings 324 are disposed along the left edge of the base film 321 at the left side of the chip mount portion 326. The second output wirings 324 are disposed parallel to each-other, and extend into the chip mount portion 326 through the left side (i.e., a third side) of the chip mount portion 326 to then be arranged within the chip mount portion 326.

Within the chip mount portion 326 (i.e., underneath the semiconductor chip 340), the second output wirings 324 bend to extend toward the back side (i.e., the second side) of the chip mount portion 326. The right side and the left side of the chip mount portion 326 are parallel to each other and are each orthogonal to the back side.

One ends 324a of the second output wirings 324 are electrically connected to input pads 342b of the gate driver semiconductor chip 340, and the other ends 324b of the second output wirings 324 are electrically connected to gate driving signal transmission lines of the display panel (101b of FIG. 4). The input pads 342b are disposed along the side of the semiconductor chip 340 that is near the back side of the chip mount portion 326.

Further referring to FIG. 5A, the bypass wirings 325 are disposed on the base film 321 along the outside of the right and left sides of the chip mount portion 326. The bypass wirings 325 are parallel to each-other along such sides. One ends 325a and the other ends 325b of the bypass wirings 225 are both connected to gate driving signal transmission lines (101a and 101b of FIG. 4).

Additionally referring to FIG. 5A, the bypass wirings 325 extend into the chip mount portion 326 through the right and left sides of the chip mount portion 326 to then be arranged within the chip mount portion 326. In one embodiment of the present invention, the bypass wirings 325 extend straight through the chip mount portion 326 from the right side to the left side of the chip mount portion 326. In this manner, the bypass wirings 325 are not electrically connected to the gate driver semiconductor chip 340. In the embodiment of FIG. 5A, the portion of the bypass wirings 325 disposed parallel to the back side of the chip mount portion 326 are disposed within the chip mount portion 326.

Additionally referring to FIG. 5A, the first output wirings 323 are disposed on the base film 321 to extend from a front side (i.e., the side toward the "f" direction in FIG. 5A) of the base film 321. The first output wirings 323 extend into the chip mount portion 326 through the front side (i.e., a fourth side) of the chip mount portion 326 to then be arranged within the chip mount portion 326.

In the embodiment of FIG. 5A, one ends 323a of the first output wirings 323 are electrically connected to output pads 343 of the gate driver semiconductor chip 340, and the other ends 323b of the first output wirings 323 are electrically connected to gate lines of the display panel (126 of FIG. 4). The output pads 343 are disposed toward the front side of the semiconductor chip 340 in FIG. 5A.

Connecting units (not shown) are typically used for connecting ends of the wirings 322, 323, and 324 to the semiconductor chip 340. Such connecting units may be metal bumps that electrically connect the wirings 322, 323, and 324 to the semiconductor chip 340. Such connecting units have a thickness of about 10 μm to about 18 μm and are comprised of a conductive material such as gold (Au), copper (Cu) or solder, in an example embodiment of the present invention. Adhesion between the connecting units and the wirings 322, 323, and 324 may be achieved by thermal compression.

FIG. 5B is a cross-sectional view along line III-III' of FIG. 5A, and FIG. 5C is a cross-sectional view along line IV-IV' of FIG. 5A. Referring to FIGS. 5B and 5C, the wirings 322, 324, and 325 are formed within the chip mount portion 326 over which the gate driver semiconductor chip 340 is mounted.

In this manner, the input wirings 322, the second output wirings 324, and the bypass wirings 325 are formed to enter through the right and left sides of the chip mount portion 326 and are arranged within the chip mount portion 326. Thus, such wirings 322, 324, and 325 are not disposed outside of the chip mount portion 326 toward the back side of the base film 321.

As a result, referring to FIG. 5A, the length L3 of the base film 321 is minimized such that the gate semiconductor chip package 320 and a display panel assembly 200 of FIG. 3 incorporating the semiconductor chip package 320 is miniaturized. In addition, the amount of an expensive film comprising the base film 321, and in turn fabrication cost, are advantageously reduced.

In the embodiment of FIG. 5A, assume for example that the number of the input wirings 322, of the second output wirings 324, or of the bypass wirings 325 is in the range of 10 to 20, such as 15, and the pitch of such wirings 322, 324, and 325 is in the range of 30 to 100 µm, such as 40 µm. In that case, since the input wirings 322, the second output wirings 324, and the bypass wirings 325 are not disposed outside of the chip mount portion 326 toward the back side of the base film 321, the length L3 of the base film 321 is reduced by approximately 1200 µm.

When the length L1 of the conventional base film 121 of FIG. 1 is approximately 5000 to approximately 15000 µm, such as 6000 µm, the length L3 of the base film 321 of FIG. 5A is approximately 4800 µm. In this manner, about 20% of the length of the base film 221 is reduced.

While the present invention has been particularly shown and described with respect to illustrative embodiments thereof, it will be understood by those skilled in the art that the foregoing and other changes in form and details may be made therein without departing from the spirit and scope of the invention which should be limited only by the scope of the appended claims. For example, any numbers illustrated and described herein are by way of example only. Thus, preferred embodiments of the invention disclosed above are used in a generic and descriptive sense only and not for purposes of limitation.

What is claimed is:

1. A display panel assembly comprising:
   a display panel including:
   a substrate;
   a first and a second transmission wirings disposed on the substrate; and
   a semiconductor chip package comprising:
   a tape circuit substrate including:
     a base film;
     a first wiring, disposed on the base film, that extends into a chip mount portion through a first side and that bends within the chip mount portion toward a second side;
     a second wiring, disposed on the base film, that extends into the chip mount portion through a third side and that bends within the chip mount portion toward the second side, wherein the first, second, and third sides are different sides of the chip mount portion; and
     third wiring, disposed on the base film, that extends into the chip mount portion through a fourth side that is orthogonal to the first side; and
   a display panel driver chip mounted on the chip mount portion;
   wherein the first and second wirings of the tape circuit substrate couple the display panel driver chip to the first and second transmission wirings of the display panel; and
   fourth wiring, disposed on the substrate of the display panel, that transfers output signals from the third wiring of the semiconductor chip package.

2. The display panel assembly of claim 1, further comprising:
   bypass wiring, disposed on the base film, that extends parallel to the second side when the bypass wiring is disposed in one of outside of or within the chip mount portion.

3. The display panel assembly of claim 1, wherein a portion of the first and second transmission wirings formed on the substrate and a portion of the first and second wirings formed on the base film face each other.

4. A display panel assembly comprising:
   a display panel including:
   a substrate;
   a first and a second transmission wirings disposed on the substrate;
   a semiconductor chip package comprising:
   a tape circuit substrate including:
     a base film;
     a first wiring, disposed on the base film, that extends into a chip mount portion through a first side and that bends within the chip mount portion toward a second side;
     a second wiring, disposed on the base film, that extends into the chip mount portion through a third side and that bends within the chip mount portion toward the second side; and
     a third wiring, disposed on the base film, that extends into the chip mount portion through a fourth side that is different from the first, second, and third sides;
   a display panel driver chip mounted on the chip mount portion;
   wherein the first, second, and third sides are different sides of the chip mount portion, and one of the first and second wiring is an input wiring; and
   fourth wiring, disposed on the substrate of the display panel, that transfers output signals from the third wiring of the semiconductor chip package.

5. The display panel assembly of claim 2, wherein the bypass wiring is disconnected from the display panel driver chip.

6. The display panel assembly of claim 1, wherein the first and second transmission wirings are gate driving signal transmission lines sending data driving signals generated form an integrated PCB to the data driver semiconductor chip.

* * * * *